United States Patent
Liu et al.

(10) Patent No.: US 8,937,389 B2
(45) Date of Patent: Jan. 20, 2015

(54) SEMICONDUCTOR DEVICES COMPRISING GSG INTERCONNECT STRUCTURES

(75) Inventors: Christianto Chih-Ching Liu, Taipei (TW); Shuo-Mao Chen, New Taipei (TW); Der-Chyang Yeh, Hsin-Chu (TW); Shang-Yun Hou, Jubei (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 15 days.

(21) Appl. No.: 13/569,017

(22) Filed: Aug. 7, 2012

(65) Prior Publication Data
US 2014/0042612 A1 Feb. 13, 2014

(51) Int. Cl.
*H01L 23/48* (2006.01)
*H01L 21/4763* (2006.01)
*H01L 23/522* (2006.01)
*H01L 21/768* (2006.01)
*H05K 1/02* (2006.01)

(52) U.S. Cl.
CPC ...... *H01L 23/5226* (2013.01); *H01L 21/76807* (2013.01); *H05K 1/0215* (2013.01)
USPC .......................................... 257/758; 438/622

(58) Field of Classification Search
None
See application file for complete search history.

(56) References Cited

U.S. PATENT DOCUMENTS 7,400,025 B2 * 7/2008 Pitts et al. ...................... 257/531
8,044,305 B2 * 10/2011 Cai et al. ......................... 174/260

* cited by examiner

*Primary Examiner* — William D Coleman
(74) *Attorney, Agent, or Firm* — Slater & Matsil, L.L.P.

(57) ABSTRACT

Semiconductor devices and methods of manufacture thereof are disclosed. In an embodiment, a method of manufacturing a semiconductor device includes forming a first conductive structure over a workpiece in a first metallization layer, the first conductive structure including a first portion having a first width and a second portion having a second width. The second width is different than the first width. The method includes forming a second conductive structure in a second metallization layer proximate the first metallization layer, and coupling a portion of the second conductive structure to the first portion of the first conductive structure.

20 Claims, 6 Drawing Sheets

SEMICONDUCTOR DEVICES COMPRISING GSG INTERCONNECT STRUCTURES

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines on the wafer. The dies may be packaged separately, in multi-chip modules, or in other types of packaging. As semiconductor devices have decreased in size, smaller packages such as wafer level packaging (WLP) have begun to be developed, in which integrated circuits (ICs) are placed on a carrier having wiring for making connection to the ICs and other electrical components. To further increase circuit density, three-dimensional (3D) ICs have also been developed, in which two or more dies or ICs are bonded together and electrical connections are formed between the dies and contact pads on an interposer, which is attached to a substrate.

Wiring of semiconductor devices is typically formed in back-end-of the line (BEOL) processes. Multiple layers of conductive material are used to form wiring and other conductive structures such as capacitors and inductors in some applications. Resistance-capacitance (RC) time constant, RC delay characteristics, and resistance of conductive wiring and conductive structures are concerns in many semiconductor devices, particularly as devices are decreased in size.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of some of the embodiments and are not necessarily drawn to scale.

DETAILED DESCRIPTION OF ILLUSTRATIVE EMBODIMENTS

The making and using of some embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to the formation of interconnect structures, conductive components, and passive components in metallization layer of semiconductor devices. Novel semiconductor devices and manufacturing methods thereof will be described herein.

In accordance with some embodiments, two or more conductive structures are formed in at least two metallization layers of a semiconductor device comprising an integrated circuit, an interposer, or a substrate for packaging an integrated circuit. The conductive structures include metal stacks connected together by vias. The metal stacks may be utilized in signal buses, GSG interconnect structures, GSSG interconnect structures, coplanar waveguides, capacitors, or inductors, to be described further herein.

Figure 1:
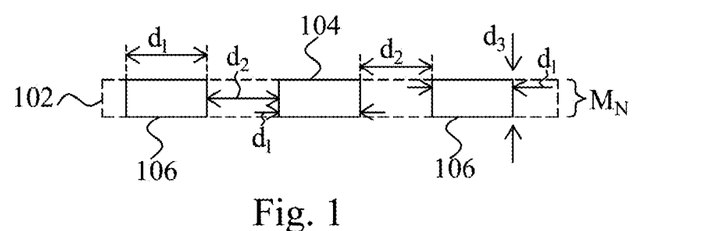
FIGS. 1 through 6 are cross-sectional views of semiconductor devices illustrating conductive structures that comprise ground-signal-ground (GSG) interconnect structures in accordance with some embodiments of the present disclosure.

FIGS. 1 through 6 illustrate cross-sectional views of conductive structures in semiconductor devices that comprise GSG interconnect structures in accordance with some embodiments of the present disclosure. The GSG interconnect structures comprise coplanar waveguides (CPWs) in some embodiments. Referring first to FIG. 1, there is shown a cross-sectional view of a semiconductor device that includes an initial design for the GSG interconnect structure. The GSG interconnect structure includes a conductive structure 102 that includes a plurality of conductive lines 104 and 106 formed in a metallization layer $M_N$. The conductive lines 104 and 106 of the conductive structure 102 comprise a signal interconnect 104 disposed between two ground interconnects 106. The ground interconnects 106 and the signal interconnect 104 are also referred to herein as portions 104 and 106 of the conductive structure 102. The signal interconnect 104 and the ground interconnects 106 have a width comprising dimension $d_1$ and are separated by a space between them having a width comprising dimension $d_2$. The signal interconnect 104 and the ground interconnects 106 comprise a thickness or height comprising dimension $d_3$. Dimension $d_1$ may comprise about 1 to 10 µm, dimension $d_2$ may comprise about 1 to 10 µm, and dimension $d_3$ may comprise about 0.8 to 2 µm in some embodiments, as examples, although alternatively, dimensions $d_1$, $d_2$, and $d_3$ may comprise other values. The portions 104 and 106 of the conductive structure 102 may extend in a top view (e.g., in a view in and out of the paper relative to the cross-sectional view shown in FIG. 1) by about several µm to several mm in some embodiments, for example. The metallization layer $M_N$ may comprise a material layer that other conductive lines (not shown) are formed in.

The ground interconnects 106 disposed on either side of the signal interconnect 104 shield the signal interconnect 104. However, a potential problem with the structure shown in FIG. 1 is that the resistance of the portions 104 and 106 of the conductive structure 102 can be high, which can cause a long signal delay. Note that the semiconductor device shown in FIG. 1 is not actually fabricated in accordance with some embodiments: FIG. 1 merely illustrates an initial design of a conductive structure 102.

Figure 2:
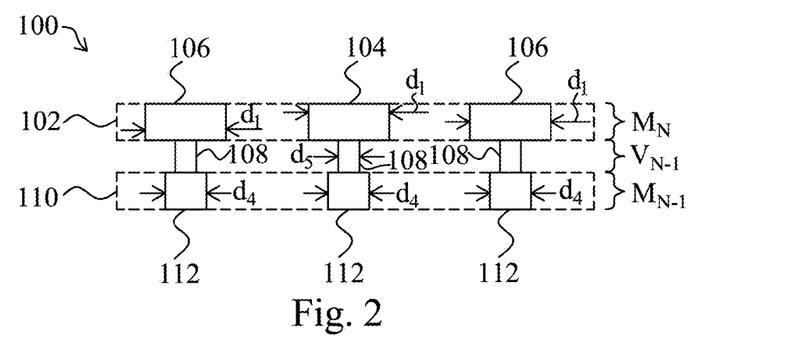

To improve performance of the initial design shown in FIG. 1, the signal interconnect 104 and the ground interconnects 106 of the interconnect structure are extended to an adjacent metallization layer $M_{N-1}$, as shown in FIG. 2, which is a cross-sectional view of a semiconductor device 100 in accordance with an embodiment of the present disclosure. A conductive structure 110 is formed in the adjacent metallization layer $M_{N-1}$ which may comprise a material layer that other conductive lines (not shown) are formed in. The conductive structure 110 is connected to conductive structure 102 by vias 108 in a metallization layer $V_{N-1}$ disposed between the metallization layers $M_N$ and $M_{N-1}$. The metallization layer $V_{N-1}$ comprises a material layer or via layer that other vias (not shown) of the semiconductor device 100 are formed in.

In the manufacturing process, the lower conductive structure 110 is fabricated first, the via layer is then fabricated over the conductive structure 110, and then the upper conductive structure 102 is formed over the via layer, to be described further herein.

The conductive structure 110 includes portions 112 having a width in the cross-sectional view shown comprising dimension $d_4$. Each portion 112 is disposed below one of the portions 104 and 106 of the conductive structure 102. The portions 112 of conductive structure 110 are also referred to herein, e.g., in some of the claims, as a plurality of conductive features. The portions 112 of conductive structure 110 may extend in a top view (e.g., in and out of the paper relative to the cross-sectional view shown in FIG. 2) by about several μm to several mm in some embodiments, for example.

In accordance with some embodiments, the width of portion 112 comprising dimension $d_4$ is different than the width of portion 104 or 106 comprising dimension $d_1$. For example, dimension $d_4$ is less than $d_1$ in the embodiment shown in FIG. 2. Alternatively, dimension $d_4$ may be greater than dimension $d_1$. In other embodiments, dimension $d_4$ may be substantially the same as dimension $d_1$. Dimension $d_4$ may comprise about half of dimension $d_1$ in some embodiments. Alternatively, dimension $d_4$ may comprise other values.

Each of the signal interconnect 104 and the ground interconnects 106 of the conductive structure 102 is coupled to one of the portions 112 of conductive structure 110 by a via 108, as shown in FIG. 2 in the cross-sectional view. The vias 108 have a width comprising a dimension $d_5$ that is less than dimensions $d_1$ and $d_4$. The resulting semiconductor device 100 structure comprises a GSG interconnect structure comprising three metal stacks, with the signal interconnect metal stack 104/108/112 being disposed between two ground interconnect metal stacks 106/108/112, as shown in FIG. 2. A plurality of vias 108 may be coupled between each portion 104 or 106 and portion 112 along the length of the metal stacks 104/108/112 and 106/108/112 in a top view, e.g., in and out of the paper relative to the cross-sectional view shown in FIG. 2.

The increased conductive material in the metal stacks by the addition of the vias 108 and the portions 112 of conductive structure 110 results in a reduced RC time constant and RC delay for the GSG interconnect structure, without requiring an increase in a thickness of the metallization layer $M_N$; rather, the adjacent metallization layer $M_{N-1}$ is used to form the additional conductive structure 110. Using an adjacent metallization layer $M_{N-1}$ rather than increasing a thickness of the portions 104 and 106 of conductive structure 102 improves design flexibility and avoids increasing manufacturing costs. The capacitance of the GSG interconnect structure may increase, but the resistance is decreased, and a semiconductor device 100 design is attainable that results in decreasing the product of R and C in some embodiments, for example. The GSG interconnect structure results in minimized resistive loss (e.g., resistance) and avoids lengthening latency in performance, for example. Because the metal stacks 104/108/112 and 106/108/112 are non-uniform, e.g., portions 104 and 106 of the conductive structure 102 comprise a different width $d_1$ than the width $d_4$ of portions 112 of the conductive structure 110 in some embodiments, an increase of coupling capacitance is advantageously avoided.

Figure 3:
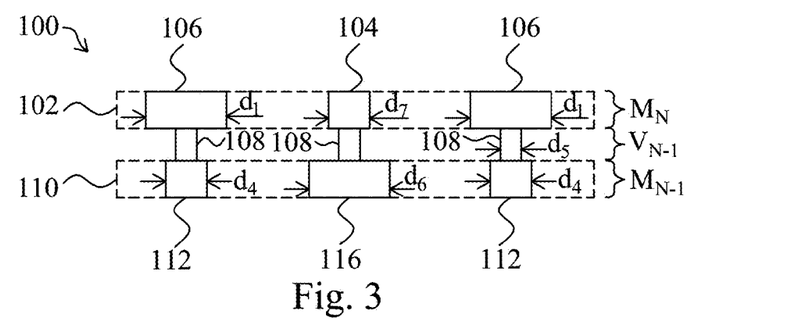

The signal interconnect metal stack 104/108/116 is flipped by about 180 degrees in another embodiment, as shown in FIG. 3 in a cross-sectional view, in order to increase a distance to a neighboring ground plane comprising a metal stack 106/108/112 and to minimize a capacitance of the structure. The orientation of the signal interconnect metal stack 104/108/116 can be adjusted to minimize capacitance to neighboring ground interconnect metal stacks 106/108/112, for example. The signal interconnect metal stack 104/108/116 has a narrower portion 104 in conductive structure 102 and a wider portion 116 in conductive structure 110, rather than vice versa in the embodiment shown in FIG. 2. Portion 104 of conductive structure 102 has a width comprising dimension $d_7$, wherein $d_7$ comprises substantially a same width as dimension $d_4$ of portions 112 of conductive structure 110. Portion 116 of conductive structure 110 has a width comprising dimension $d_6$, wherein $d_6$ comprises substantially a same width as dimension $d_1$ of portions 106 of conductive structure 102. Portion 104 of conductive structure 102 may be spaced apart from portions 106 of conductive structure 102 by substantially a same distance as portion 116 of conductive structure 110 is spaced apart from portions 112 of conductive structure 110 in an embodiment, in order to minimize capacitance. Alternatively, dimensions $d_6$ and $d_7$ may comprise other values, and the portions 104 and 106 and portions 116 and 112 may be spaced apart by other relative amounts. In some embodiments, dimensions $d_1$, $d_4$, $d_6$, and $d_7$ may be substantially the same, not shown.

Figure 4:
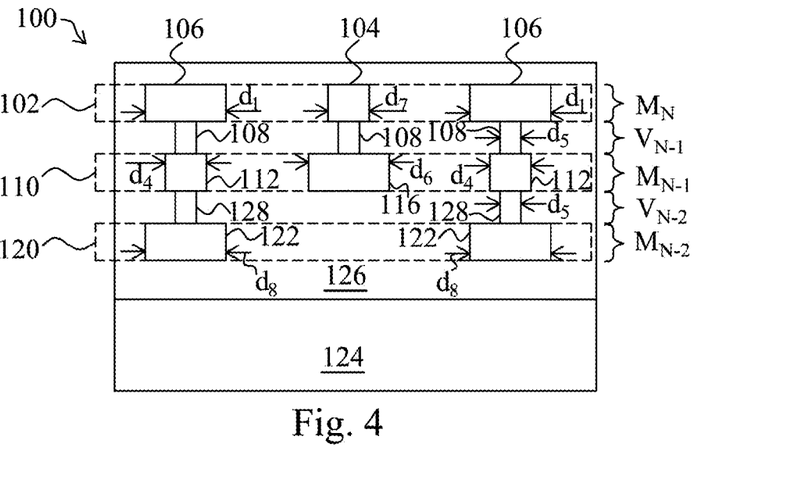

FIG. 4 shows another embodiment wherein the ground interconnects comprise an extended stacked structure formed in yet another metallization layer $M_{N-2}$ in a conductive structure 120. The ground interconnects are extended to an additional metallization layer $M_{N-2}$. The conductive structure 120 in metallization layer $M_{N-2}$ is disposed between conductive structure 110 and the workpiece 124. The ground interconnects comprise metal stacks 106/108/112/128/122 in this embodiment. The conductive structure 120 comprises portions 122 disposed below portions 112 in conductive structure 110. The portions 112 of conductive structure 120 are also referred to herein, e.g., in some of the claims, as a plurality of conductive features. Portions 122 of conductive structure 120 are connected to the portions 112 of conductive structure 110 by vias 128 formed in a metallization layer $V_{N-2}$. The metallization layer $V_{N-2}$ comprises a material layer that other vias (not shown) of the semiconductor device 100 are formed in. The vias 128 have a width comprising a dimension $d_5$ that is less than dimensions $d_1$ and $d_4$. The width of the vias 128 may be substantially the same as the width of the vias 108 in metallization layer $V_{N-1}$, for example.

Portions 122 of conductive structure 120 in metallization layer $M_{N-2}$ have a width comprising dimension $d_8$. Dimension $d_8$ may be substantially the same width as dimension $d_1$ comprising the width of portions 106 of conductive structure 102.

Dimension $d_8$ may also comprise the same width as dimension $d_6$ comprising the width of portions 116 of conductive structure 110. Alternatively, dimension $d_8$ may comprise other values. In some embodiments, dimensions $d_1$, $d_4$, $d_6$, $d_7$ and $d_8$ may be substantially the same, not shown.

When current is passed through the signal interconnect metal stack 104/108/116, an E-field is generated in some embodiments. The extended ground interconnects 106/108/112/128/122 of the embodiment shown in FIG. 4 advantageously allow signal E-field lines to terminate at ground, rather than at the silicon substrate (which can increase substrate coupling noise). The silicon substrate is illustrated by the workpiece 124 shown in FIG. 4, for example. Ground planes can be extended to another metal layer (e.g., metallization layer $M_{N-2}$) without extending the signal interconnect comprising metal stack 104/108/116 disposed between the ground interconnect stacks 106/108/112/128/122, in order to further improve isolation from the workpiece 124.

To manufacture the semiconductor devices 100 shown in FIGS. 2 through 4, first, the workpiece 124 is provided (workpiece 124 is not shown in FIGS. 2 and 3; see FIG. 4). The workpiece 124 may include a semiconductor substrate comprising silicon or other semiconductor materials and may be covered by an insulating layer, for example. The workpiece 124 may also include other active components or circuits, not shown. The workpiece 124 may comprise silicon oxide over single-crystal silicon, for example. The workpiece 124 may include other conductive layers or other semiconductor elements, e.g., transistors, diodes, etc. Compound semiconductors, GaAs, InP, Si/Ge, or SiC, as examples, may be used in place of silicon. The workpiece 124 may comprise a silicon-on-insulator (SOI) or a germanium-on-insulator (GOI) substrate, as examples. The workpiece 124 comprises an interposer or a substrate in some embodiments that may be used to package an integrated circuit in a 3DIC package, in some embodiments.

The metallization layers $M_{N-2}$, $V_{N-2}$, $M_{N-1}$, $V_{N-1}$, and $M_N$ are formed sequentially over the workpiece 124, disposed within an insulating material 126 comprising an interlayer dielectric. The insulating material 126 may comprise silicon dioxide, silicon nitride, other dielectric materials, or combinations and multiple layers thereof. The insulating material 126 separates and isolates the conductive portions 122, 112, 116, 112, 104, 106 and vias 128 and 108 in the various metallization layers $M_{N-2}$, $V_{N-2}$, $M_{N-1}$, $V_{N-1}$, and $M_N$. Metallization layers $M_{N-2}$, $M_{N-1}$, and $M_N$ comprise conductive line layers, and metallization layers $V_{N-2}$ and $V_{N-1}$ comprise via layers, in a multi-layer interconnect structure for a semiconductor device 100 that comprises an integrated circuit, interposer, or substrate. Portions of the metallization layers $M_{N-2}$, $V_{N-2}$, $M_{N-1}$, $V_{N-1}$, and $M_N$ may be coupled to one another and to portions of the workpiece 124.

Each metallization layer $M_{N-2}$, $V_{N-2}$, $M_{N-1}$, $V_{N-1}$, and $M_N$ may be formed using a subtractive etch process or a damascene process. In a subtractive etch process, a conductive material is formed over the workpiece 124 or over a portion of the insulating material 126 disposed over the workpiece 124. The conductive material is then patterned using lithography into the desired shape. Another portion of the insulating material layer 126 is then formed over and between the patterned conductive material.

In a damascene process, a portion of the insulating material 126 is formed over the workpiece 124, and the portion of the insulating material 126 is patterned using lithography. The patterns in the portion of the insulating material 126 are filled in with a conductive material, and excess conductive material is removed from over the top surface of the portion of the insulating material layer using a chemical mechanical polishing (CMP) process and/or etch process. Two or more portions of the insulating material 126 may be patterned using a dual damascene process, forming two adjacent metallization layers $M_{N-2}$, $V_{N-2}$, $M_{N-1}$, $V_{N-1}$, and $M_N$ simultaneously, as another example. Alternatively, the metallization layers $M_{N-2}$, $V_{N-2}$, $M_{N-1}$, $V_{N-1}$, and $M_N$ may be formed using other methods. The metallization layers $M_{N-2}$, $V_{N-2}$, $M_{N-1}$, $V_{N-1}$, and $M_N$ comprise conductive materials such as Cu, Al, other materials, or combinations and multiple layers thereof, as examples. Alternatively, the metallization layer $M_{N-2}$, $V_{N-2}$, $M_{N-1}$, $V_{N-1}$, and $M_N$ may comprise other materials.

The semiconductor devices 100 comprising the interconnect structures shown in FIGS. 2 through 4 illustrate GSG interconnect structures that may be adapted to operate at about 1 GHz in some embodiments, as an example. In other embodiments, the GSG interconnect structures may be adapted to operate at other frequencies. The GSG interconnect structure shown in FIGS. 2 through 4 may also be used in other types of ground-signal-ground (GSG) busses.

Figure 5:
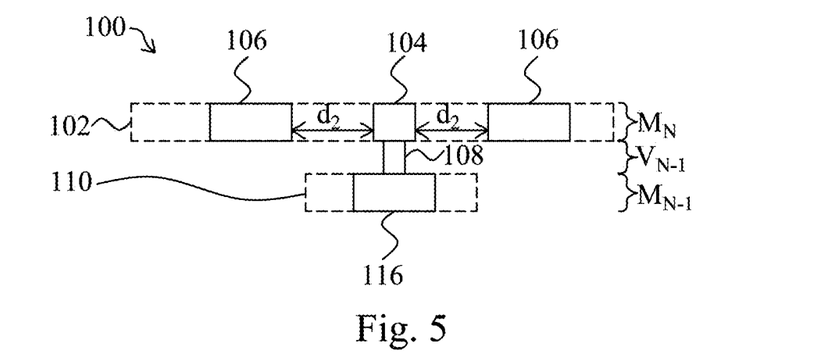
Figure 6:
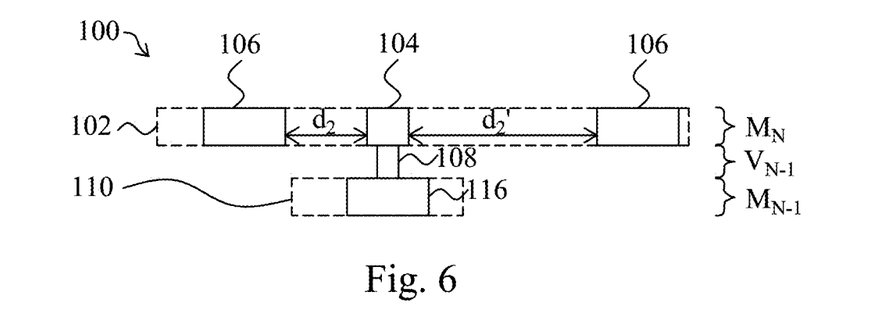

FIG. 5 is a cross-sectional view illustrating a semiconductor device 100 comprising a GSG interconnect structure in accordance with an embodiment wherein the signal interconnect 104, but not the ground interconnects 106, is extended to an adjacent metallization layer $M_{N-1}$. The signal interconnect comprises a metal stack 104/108/116 in this embodiment. The ground interconnects 106 comprise a single layer ground plane formed in conductive structure 102. The ground interconnects 106 may be symmetrically spaced apart from the signal interconnect metal stack 104/108/116 as shown in FIG. 5, wherein the distances $d_2$ between each ground interconnect 106 and the signal interconnect metal stack 104/108/116 are substantially the same. Alternatively, the ground interconnects 106 may be asymmetrically spaced apart from the signal interconnect metal stack 104/108/116 as shown in FIG. 6, wherein the distances $d_2$ and $d_{2'}$ between each ground interconnect 106 and the signal interconnect metal stack 104/108/116 are different.

Figure 7:
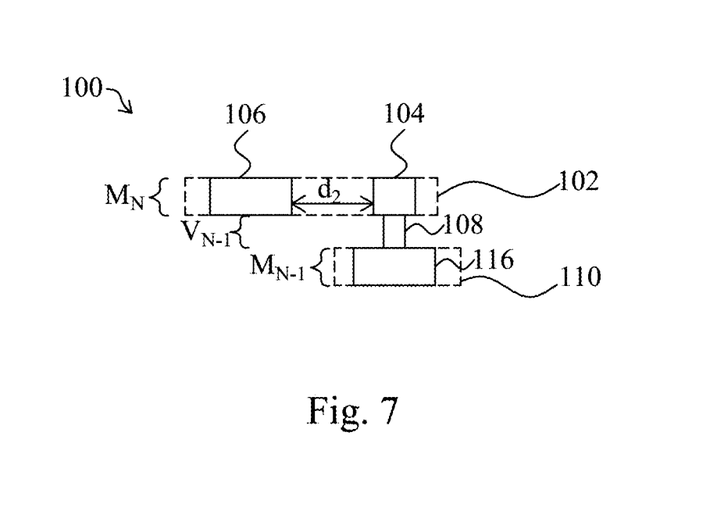
FIG. 7 is a cross-sectional view illustrating a conductive structure that comprises an interconnect structure grounded on one side in accordance with an embodiment.

The novel metal stacks are also implementable in semiconductor devices 100 comprising interconnect structures that are grounded on only one side, as shown in FIG. 7. The signal interconnect comprises a metal stack 104/108/116 in this embodiment. The ground interconnect 106 is disposed in conductive structure 102 on the left side of the signal interconnect metal stack 104/108/116. The ground interconnect 106 may also be extended to the adjacent metallization layer $M_{N-1}$, not shown. The signal interconnect metal stack 104/108/116 may alternatively be grounded on the right side, rather than on the left side as shown in FIG. 7; e.g., the ground interconnect 106 may be disposed in conductive structure 102 on the right side of the signal interconnect metal stack 104/108/116. Alternatively, the signal interconnect metal stack 104/108/116 may be grounded by forming a portion 116 of conductive structure 110 to the right or left of portion 116 of the signal interconnect metal stack 104/108/116, not shown. In some embodiments, the signal interconnect metal stack 104/108/116 is not grounded and the portion 116 of the conductive structure 110 is not included.

Figure 8:
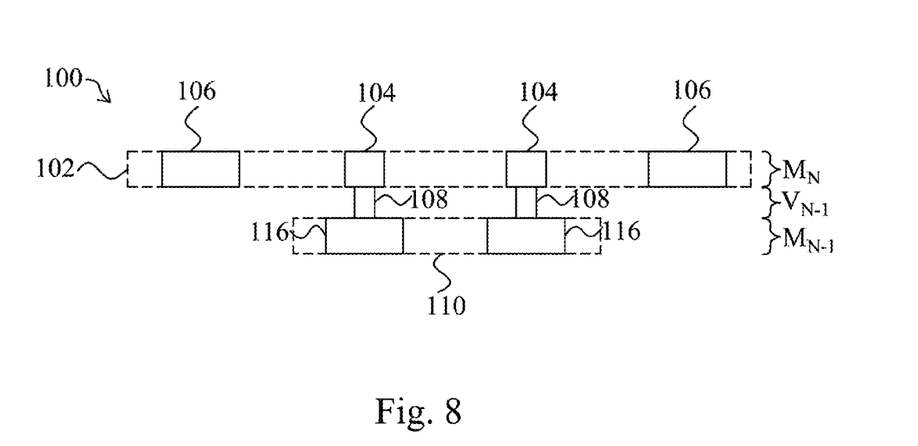
FIGS. 8 and 9 are cross-sectional views illustrating conductive structures that comprise ground-signal-signal-ground (GSSG) interconnect structures in accordance with some embodiments.
Figure 9:
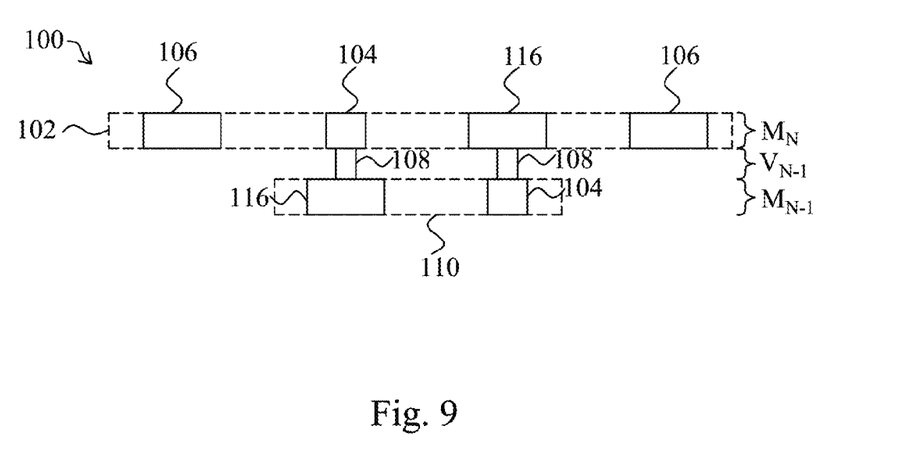

FIGS. 8 and 9 are cross-sectional views illustrating semiconductor devices 100 including conductive structures that comprise ground-signal-signal-ground (GSSG) interconnect structures in accordance with some embodiments. Rather than having only one signal interconnect disposed between two ground interconnects, two or more signal interconnects may be disposed between two ground interconnects, as shown. The signal interconnects each comprise a metal stack 104/108/116 in this embodiment. Three or more signal interconnects comprising metal stacks 104/108/116 may alternatively be disposed between two ground interconnects 106, not shown. The ground interconnects 106 in this embodiment may also be extended to the adjacent metallization layer $M_{N-1}$, as shown in FIG. 3. The ground interconnects 106 may also be extended to an additional adjacent metallization layer $M_{N-2}$, as shown in FIG. 4. One or more of the signal interconnect metal stacks 104/108/116 can be flipped by about 180 degrees in another embodiment, as shown in FIG. 9 in a cross-sectional view, in order to increase the distance to neighboring ground planes 106 and to minimize capacitance of the structure, similar to the embodiment shown in FIG. 3.

Figure 11:
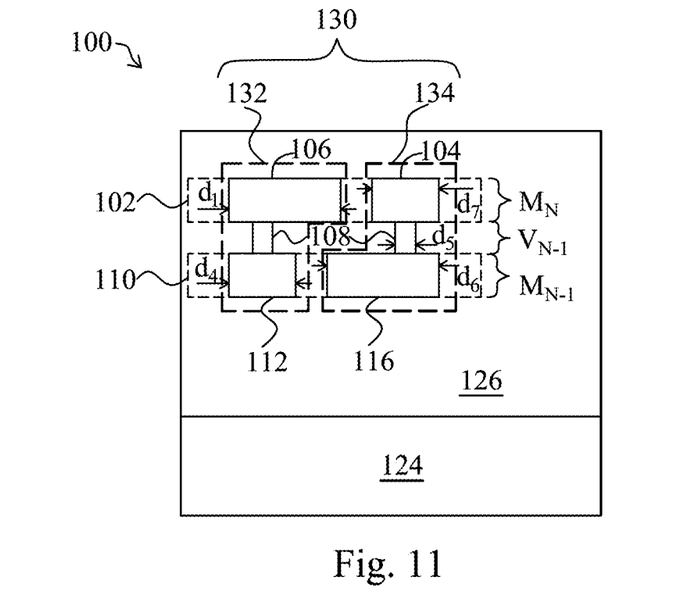
Figure 12:
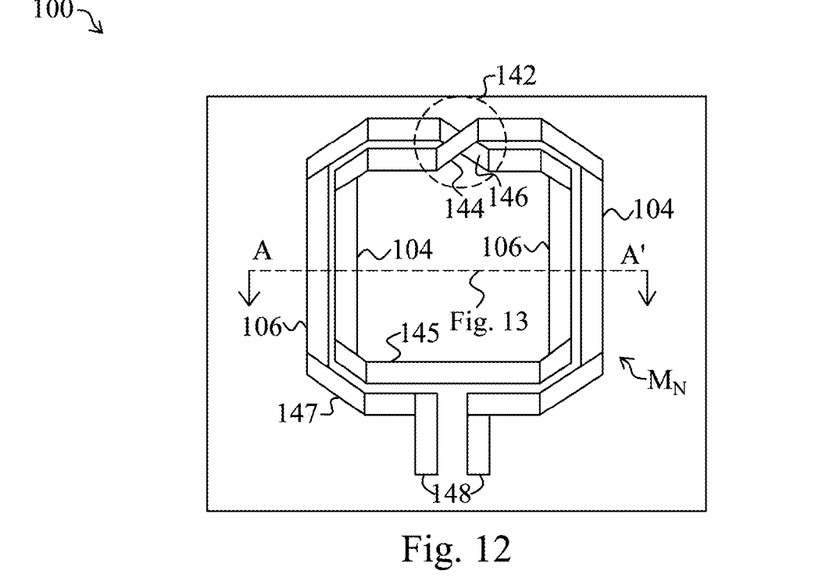
FIGS. 12 and 13 show a top view and a cross-sectional view, respectively, of conductive structures comprising inductors in accordance with an embodiment.
Figure 13:
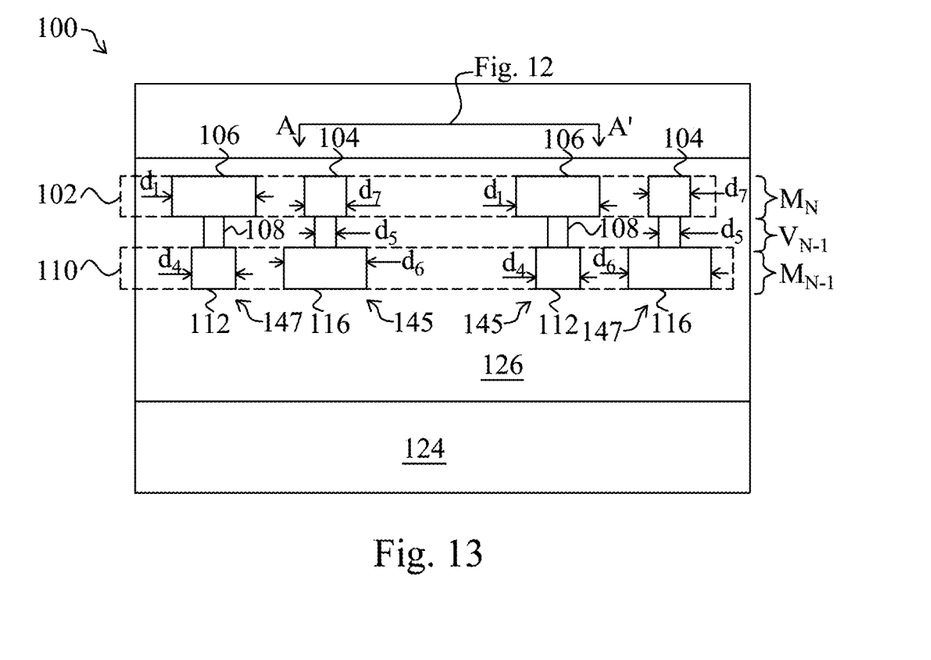

The embodiments and portions thereof described for FIGS. 2 through 9 may also be implemented in other structures having conductive components. For example, the metal stacks may be implemented in passive components, such as capacitors 130 as shown in FIG. 11 and inductors as shown in FIGS. 12 and 13. In these embodiments, the dimensions $d_1$, $d_4$, $d_5$, $d_6$, $d_7$ may be smaller than described for FIGS. 1 through 9. Dimensions $d_1$, $d_4$, $d_5$, $d_6$, and $d_7$ of the portions 106, 104, 112, and 116 and vias 108 may be about 1 to 2 μm or less, and dimension $d_5$ of the vias 108 may comprise on the order of about 0.5 μm, as examples. Alternatively, $d_1$, $d_4$, $d_5$, $d_6$, and $d_7$ may comprise other values.

Figure 10:
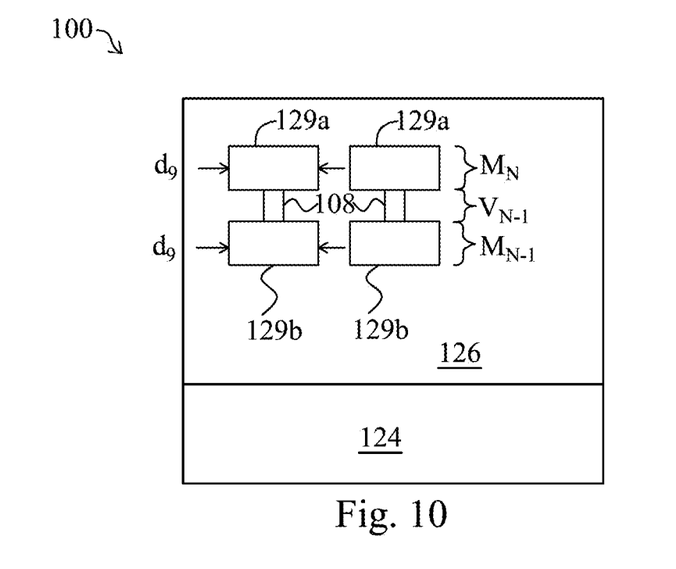
FIGS. 10 and 11 show cross-sectional views that illustrate conductive structures comprising capacitors in accordance with another embodiment.

For example, FIGS. 10 and 11 show cross-sectional views of a conductive structure comprising a capacitor 130 in accordance with an embodiment. FIG. 10 illustrates an initial design for a capacitor wherein portions 129a and 129b of conductive material are designed to be formed in metallization layers $M_{N-1}$ and $M_N$ and to be coupled together by a via 108 in metallization layer $V_{N-1}$. Each metal stack 129a/108/129b comprises a plate of a capacitor. The metal stacks 129a/108/129b are uniform in the initial design; e.g., 129a and 129b comprise the same width comprising dimension $d_9$. Dimension $d_9$ may comprise about 1 to 2 μm or less, although alternatively, dimension $d_9$ may comprise other values. In accordance with an embodiment, the initial design shown in FIG. 10 is modified to the structure shown in FIG. 11, wherein the metal stacks 106/108/112 and 104/108/116 of the capacitor 130 are non-uniform.

Capacitor plate 132 of the capacitor 130 comprises metal stack 106/108/112 and capacitor plate 134 comprises metal stack 104/108/116. The different widths comprising dimensions $d_1$ and $d_7$ of the portions 106 and 104, respectively, in conductive structure 102 and the different widths comprising dimensions $d_4$ and $d_6$ of the portions 112 and 116, respectively, in conductive structure 110 provide a staggered, non-uniform capacitor 130 having a shape that minimizes resistance and maximizes capacitance for metal-oxide-metal (MOM) structures, for example. The portions of the insulating material 126 disposed between the capacitor plates 132 and 134 function as a capacitor dielectric of the capacitor 130.

The capacitor 130 comprises a similar structure described for the GSG interconnect structure shown in FIG. 3, without the right-most metal stack 106/108/112 included in the structure. For example, conductive structure 102 is formed in a first metallization layer $M_N$ disposed over a workpiece 124. Conductive structure 102 includes a portion 106 having a first width comprising dimension $d_1$ and a portion 104 having a second width comprising dimension $d_7$. The second width $d_7$ is different than the first width $d_1$. Conductive structure 110 is formed in a second metallization layer $M_{N-1}$ proximate the first metallization layer $M_N$. Conductive structure 110 includes a portion 112 having a third width $d_4$ and a portion 116 having a fourth width $d_6$. The fourth width $d_6$ is different than the third width $d_4$. Portion 106 of conductive structure 102 is coupled to portion 112 of conductive structure 110 by a via 108 in a third metallization layer $V_{N-1}$ disposed between metallization layers $M_N$ and $M_{N-1}$. Portion 104 of conductive structure 102 is coupled to portion 116 of conductive structure 110 by a via 108 in the third metallization layer $V_{N-1}$. The second width $d_7$ is less than the first width $d_1$, and the fourth width $d_6$ is greater than the third width $d_4$. The first width $d_1$ is substantially the same as the fourth width $d_6$, and the second width $d_7$ is substantially the same as the third width $d_4$, in some embodiments. Alternatively, the portions 104, 106, 112, and 116 may comprise other relative dimensions.

FIGS. 12 and 13 show a top view and a cross-sectional view, respectively, of a semiconductor device 100 including a conductive structure comprising an inductor in accordance with an embodiment. The top view in FIG. 12 shows a spiral inductor comprising two windings 145 and 147 with cross-over wires 144 and 146 in region 142. The two windings 145 and 147 comprise an inner winding 145 and an outer winding 147. Only two windings 145 and 147 are shown in FIG. 12; alternatively, the inductor may include only one winding, or three or more windings, as examples (not shown). The spiral inductor has terminals 148 at the ends of a conductive coil formed in multiple metallization layers $M_{N-1}$, $V_{N-1}$, and $M_N$, as shown in a cross-sectional view in FIG. 13. A view of FIG. 12 at A-A' is shown in FIG. 13. Cross-over wire 144 is formed in metallization layer $M_N$, and cross-over wire 146 is formed in metallization layer $M_{N-1}$. The remainder of the inductor is formed in both metallization layers $M_{N-1}$ and $M_N$, as illustrated in FIG. 13. A cross-section of a perimeter of the inductor includes portions 104 and 106 of conductive structure 102 and portions 112 and 116 of conductive structure 110. Dimension $d_4$ of portion 112 of conductive structure 110 may be different than, or substantially the same as, dimension $d_1$ of portion 106 of conductive structure 102. Likewise, dimension $d_6$ of portion 116 of conductive structure 110 may be different than, or substantially the same as, dimension $d_7$ of portion 104 of conductive structure 102, for example.

The inductor structure minimizes resistance in the inductor lines and improves a quality factor of the inductor, which is inversely proportional to the resistance. Improved signal continuity of the inductor is also achieved by forming portions of the inductor in both metallization layers $M_{N-1}$ and $M_N$, in comparison to existing inductors that are formed in a single metallization layer.

The capacitor 130 shown in FIG. 11 and the inductor shown in FIGS. 12 and 13 may be formed in three or more metallization layers of a semiconductor device 100 in accordance with some embodiments. For example, the plates 132 and 134 of the capacitor 130 comprising the metal stacks may be extended to three or more metallization layers, with portions of the metallization layers being coupled together by vias in via layers between the metallization layers, similar to the extension of the ground interconnects in the embodiment shown in FIG. 4. Similarly, the windings 145 and 147 of the inductor may be extended to three or more metallization layers.

Figure 14:
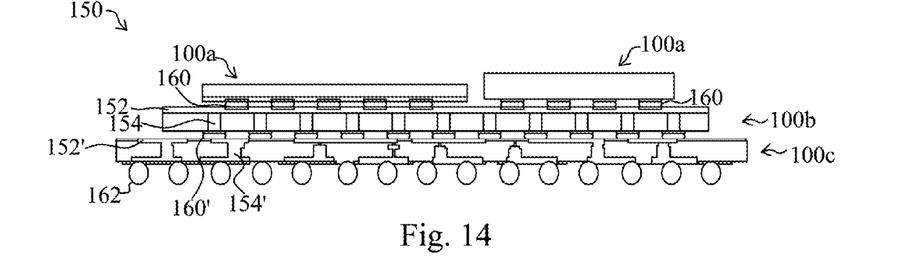
FIG. 14 is a cross-sectional view illustrating a packaged 3DIC in which the novel conductive structures described herein may be implemented in accordance with an embodiment.

FIG. 14 is a cross-sectional view of a packaged 3DIC 150 that includes two integrated circuit 100a dies attached to an interposer 100b, which are attached to a substrate 100c. Alternatively, one die 100a or three or more dies 100a may be attached to the interposer 100b, not shown. The interposer 100b may comprise a silicon interposer or an interposer comprised of other types of materials, for example. The integrated circuits 100a, the interposer 100b, and/or the substrate 100c may include the novel conductive structures comprising metal stacks described herein in accordance with an embodiment. One or more interconnect structures, signal buses, capacitors 130, or inductors comprising metal stacks may be formed in a semiconductor device 100 comprising an integrated circuit 100a, interposer 100b, and/or substrate 100c for packaging integrated circuits 100a. The 3DIC 150 is formed by providing a substrate 100c, providing the interposer 100b, and providing the integrated circuits 100a. The interconnect structures, signal buses, capacitors 130, or inductors may be formed in metallization layers of the integrated circuits 100a and interposer 100b formed in a BEOL process. Alternatively, or additionally, the interconnect structures, signal buses, capacitors 130, or inductors described herein may be formed in conductive layers or redistribution layers (RDLs) 152 and 152' of the interposer 100b and/or the substrate 100c, respectively. One or more integrated circuits 100a are attached to bond pads on the interposer 100b by microbumps 160. The interposer 100b is attached to bond pads on the substrate 100c by controlled collapse chip connection (C4) bumps 160'. The substrate 100c may include a plurality of through-hole vias (THVs) 154' formed in a substrate or workpiece, which provide connections from a top side to a bottom side of the substrate 100c. Ball grid array (BGA) balls 162 comprising solder may be coupled to an opposite side of the substrate 100c. The interposer 100b may also include a plurality of through-silicon vias (TSVs) 154 formed therein.

Figure 15:
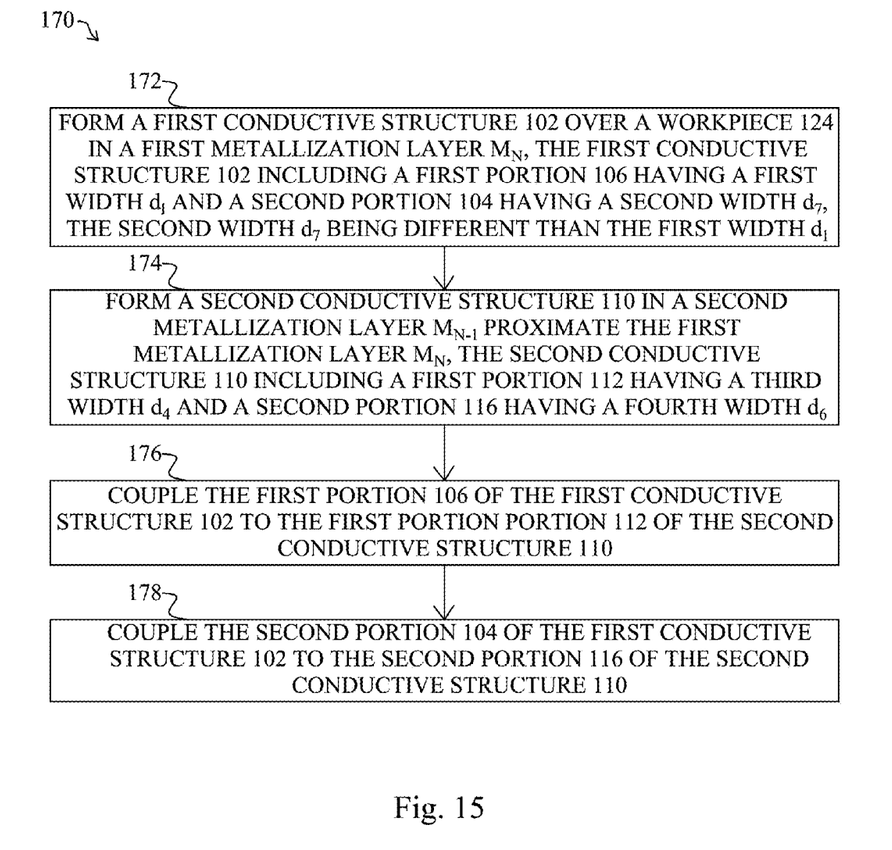
FIG. 15 is a flow chart of a method of manufacturing a conductive structure of a semiconductor device in accordance with an embodiment.

FIG. 15 is a flow chart 170 illustrating a method of manufacturing a conductive structure of a semiconductor device 100 shown in FIG. 4 in accordance with an embodiment. In step 172, a first conductive structure 102 is formed over a workpiece 124 in a first metallization layer $M_N$. The first conductive structure 102 includes a first portion 106 having a first width $d_1$ and a second portion 104 having a second width $d_7$, the second width $d_7$ being different than the first width $d_1$. In step 174, a second conductive structure 110 is formed in a second metallization layer $M_{N-1}$ proximate the first metallization layer $M_N$. The second conductive structure 110 includes a first portion 112 having a third width $d_4$ and a second portion 116 having a fourth width $d_6$. In step 176, the first portion 106 of the first conductive structure 102 is coupled to the first portion 112 of the second conductive structure 110. In step 178, the second portion 104 of the first conductive structure 102 is coupled to the second portion 116 of the second conductive structure 110.

The various metallization layers $M_{N-2}$, $V_{N-2}$, $M_{N-1}$, $V_{N-1}$, and $M_N$ described herein may be formed in reverse order and may be located at any conductive material level within a semiconductor device 100, 100a, 100b, and 100c. As one example, metallization layer $M_{N-1}$ may reside over metallization layer $M_N$. Each of the figures illustrated herein may be formed as an inverted structure of the device 100 shown, as another example.

Various embodiments of the present disclosure include methods of forming semiconductor devices 100, 100a, 100b, and 100c that include the conductive structures described herein, and also include semiconductor devices 100, 100a, 100b, and 100c that include the novel conductive structures. Various embodiments of the present disclosure also include design methods for interconnect structures, passive components, and other elements having conductive components. Various embodiments of the present disclosure also include packaged devices that include the novel semiconductor devices 100, 100a, 100b, and 100c described herein.

Advantages of some embodiments of the disclosure include providing novel metal stack structures that are implementable in conductive structures such as interconnect structures, signal buses, capacitors 130, and inductors. When used in GSG interconnect structures, a novel transmission line is provided that reduces RC delay and provides a cost savings by avoiding increasing a thickness of a metallization layer. The GSG interconnect structures provide high-performance interconnect bus structures having low latency, low signal loss (resistance), high bandwidth, and high signal integrity by tuning the width, placement, and orientation of adjacent stacked metal layers. Advantageously, the GSG interconnect structures may be utilized in complementary metal oxide semiconductor (CMOS) BEOL conductive structures or on silicon interposer wafers. The GSG interconnect structures are particularly advantageous in high speed applications that operate at a speed on the order of Kbps or Mbps or greater, where the transfer of high speed data is required, for example. Capacitance of the GSG interconnect structures may be minimized by varying the width, placement, and orientation of the signal and ground interconnects. The methods and structures described herein provide a wide range of tuning for RC delay, bandwidth, and signal integrity for both low (e.g., on the order of MHz or less) and high (e.g., on the order of MHz or greater) frequency applications.

When utilized in capacitors 130 and inductors, resistance of the structures is minimized, resulting in capacitors 130 with improved performance and inductors with improved quality factors.

Furthermore, the novel semiconductor structures, designs, and manufacturing methods are easily implementable in manufacturing process flows. Optimization of circuit performance can be achieved with no changes to existing manufacturing process parameters, other than altering lithography masks or processes for the metallization layers $M_{N-2}$, $V_{N-2}$, $M_{N-1}$, $V_{N-1}$, and $M_N$ to include the portions 104, 106, 112, 116, and 122 and vias 108 and 128 of the conductive structures 102, 110, and 120 described herein. The stacked metal structures function similar to a single thick wire, advantageously improving performance of the devices described herein.

In accordance with one embodiment of the present disclosure, a method of manufacturing a semiconductor device includes forming a first conductive structure over a workpiece in a first metallization layer, the first conductive structure including a first portion having a first width and a second portion having a second width, the second width being different than the first width. The method includes forming a second conductive structure in a second metallization layer proximate the first metallization layer, and coupling a portion of the second conductive structure to the first portion of the first conductive structure.

In accordance with another embodiment, a semiconductor device includes a workpiece and a GSG interconnect structure disposed over the workpiece in a first metallization layer. The GSG interconnect structure includes a signal interconnect disposed between two ground interconnects. The signal interconnect and the two ground interconnects each have a first width. The semiconductor device includes a conductive structure disposed in a second metallization layer proximate the first metallization layer. The conductive structure includes a plurality of conductive features each having a second width, the second width being different than the first width. One of the plurality of conductive features in the conductive structure is coupled to the signal interconnect. Another one of the plurality of conductive features is coupled to each of the two ground interconnects.

In accordance with yet another embodiment, a semiconductor device includes a workpiece and a first conductive structure disposed over the workpiece in a first metallization layer. A first portion of the first conductive structure has a first width, and a second portion of the first conductive structure has a second width, the second width being different than the first width. A second conductive structure is disposed in a second metallization layer proximate the first metallization layer. A first portion of the second conductive structure has a third width, and a second portion of the second conductive structure has a fourth width. The fourth width is different than the third width. The first portion of the first conductive structure is coupled to the first portion of the second conductive structure, and the second portion of the first conductive structure is coupled to the second portion of the second conductive structure.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
    forming a first conductive structure over a workpiece in a first metallization layer, the first conductive structure including a first signal interconnect having a first width and a first ground interconnect electrically isolated from the first signal interconnect and having a second width;
    forming a second conductive structure in a second metallization layer proximate the first metallization layer, the second conductive structure including a second signal interconnect and a second ground interconnect electrically isolated from the second signal interconnect;
    coupling the second signal interconnect to the first signal interconnect by a first via disposed in a third metallization layer, the third metallization layer being disposed between the first metallization layer and the second metallization layer, the first via having a width smaller than the first width; and
    coupling the second ground interconnect to the first ground interconnect by a second via disposed in the third metallization layer, the second via having a width smaller than the second width.

2. The method according to claim 1, wherein the second width is different than the first width.

3. The method according to claim 1, wherein forming the second conductive structure comprises forming the second signal interconnect having a third width and forming the second ground interconnect a fourth width, the fourth width being different than the third width.

4. The method according to claim 1, wherein forming the second conductive structure comprises forming the second signal interconnect having a third width and forming the second ground interconnect having a fourth width, wherein the third width is different than the first width, and wherein the fourth width is different than the second width.

5. The method according to claim 1, wherein forming the second conductive structure comprises forming the second signal interconnect having a third width and forming the second ground interconnect having a fourth width, and wherein the third width is substantially the same as the first width.

6. The method according to claim 1, wherein the first conductive structure comprises a plurality of the first ground interconnects each having the second width, wherein the second via comprises a plurality of the second vias, wherein forming the first conductive structure comprises forming a ground-signal-ground (GSG) interconnect structure or a coplanar waveguide (CPW), wherein the GSG interconnect structure or the CPW includes a signal interconnect disposed between two ground interconnects of the plurality of first ground interconnects, wherein the second conductive structure comprises a plurality of the second ground interconnects, and wherein the method further comprises coupling each of the first ground interconnects to a respective one of the plurality of second ground interconnects by a respective one of the plurality of second vias.

7. The method according to claim 1, wherein forming the first conductive structure and forming the second conductive structure comprise forming a capacitor, wherein the first signal interconnect and the second signal interconnect comprise a first capacitive plate, and wherein the first ground interconnect and the second ground interconnect comprise a second capacitive plate proximate the first capacitive plate.

8. The method according to claim 2, wherein forming the first conductive structure comprises forming the first ground interconnect proximate a first side of the first signal interconnect and a third ground interconnect proximate a second side of the first signal interconnect, the second side being opposite the first side.

9. The method according to claim 8, wherein a first distance between the first ground interconnect and the first signal interconnect is substantially the same as a second distance between the third ground interconnect and the first signal interconnect.

10. The method according to claim 8, wherein a first distance between the first ground interconnect and the first signal interconnect is different than a second distance between the third ground interconnect and the first signal interconnect.

11. The method according to claim 8, wherein forming the first conductive structure comprises forming a plurality of the first signal interconnects disposed between the first ground interconnect and the third ground interconnect.

12. The method according to claim 6, further comprising forming a third conductive structure in fourth metallization layer proximate the second metallization layer, the third conductive structure including a plurality of third ground interconnects, wherein each of the plurality of third ground interconnects is coupled to a respective one of the plurality of second ground interconnects.

13. The method according to claim 12, wherein each of the plurality of third ground interconnects comprises substantially the first width.

14. A semiconductor device, comprising:
    a workpiece;
    a ground-signal-ground (GSG) interconnect structure disposed over the workpiece in a first metallization layer, the GSG interconnect structure including a signal interconnect disposed between two ground interconnects, the signal interconnect and the two ground interconnects each comprising a first width; and a conductive structure disposed in a second metallization layer proximate the first metallization layer, the conductive structure comprising a plurality of conductive features each having a second width, the second width being different than the first width, wherein one of the plurality of conductive features in the conductive structure is coupled to the signal interconnect, and wherein another one of the plurality of conductive features is coupled to a respective one of the two ground interconnects.

15. The semiconductor device according to claim 14, wherein the first width is in a range from about 1 micrometer to about 10 micrometers.

16. The semiconductor device according to claim 14, wherein the second width is about half of the first width.

17. The semiconductor device according to claim 14, wherein a thickness of the first conductive structure and a thickness of the second conductive structure are in a range from about 0.8 micrometers to about 2 micrometers.

18. A semiconductor device, comprising:
a workpiece;
a first conductive structure disposed over the workpiece in a first metallization layer, a first portion of the first conductive structure comprising a first signal interconnect having a first width, and a second portion of the first conductive structure comprising a first ground interconnect, electrically isolated from the first signal interconnect and having a second width, the second width being different than the first width; and
a second conductive structure disposed in a second metallization layer proximate the first metallization layer, wherein a first portion of the second conductive structure comprises a second signal interconnect having a third width, wherein a second portion of the second conductive structure comprises a second ground interconnect, electrically isolated from the second signal interconnect and having a fourth width, the fourth width being different than the third width, wherein the first signal interconnect is coupled to the second signal interconnect by a first via having a width smaller than the first width and the third width, and wherein the first ground interconnect is coupled to the second ground interconnect by a second via having a width smaller than the second width and the fourth width.

19. The semiconductor device according to claim 18, wherein the second conductive structure improves a resistance, a capacitance, an RC delay, or a quality factor of the first conductive structure.

20. The semiconductor device according to claim 18, wherein the first conductive structure and the second conductive structure are disposed on an integrated circuit die, an interposer, or a packaging substrate.

* * * * *